US011164730B2

(12) United States Patent
Ikeda et al.

(10) Patent No.: US 11,164,730 B2
(45) Date of Patent: Nov. 2, 2021

(54) PLASMA PROBE DEVICE AND PLASMA PROCESSING APPARATUS

(71) Applicant: TOKYO ELECTRON LIMITED, Tokyo (JP)

(72) Inventors: Taro Ikeda, Yamanashi (JP); Tomohito Komatsu, Yamanashi (JP); Yuki Osada, Yamanashi (JP); Hiroyuki Miyashita, Yamanashi (JP); Susumu Saito, Yamanashi (JP); Kazuhiro Furuki, Yamanashi (JP); Mikio Sato, Yamanashi (JP); Eiki Kamata, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 141 days.

(21) Appl. No.: 16/122,226

(22) Filed: Sep. 5, 2018

(65) Prior Publication Data

US 2019/0074166 A1 Mar. 7, 2019

(30) Foreign Application Priority Data

Sep. 5, 2017 (JP) .............................. JP2017-170114
May 30, 2018 (JP) .............................. JP2018-104108

(51) Int. Cl.
*H01J 37/32* (2006.01)

(52) U.S. Cl.
CPC .... *H01J 37/32935* (2013.01); *H01J 37/3222* (2013.01); *H01J 37/32238* (2013.01); *H01J 2237/0206* (2013.01)

(58) Field of Classification Search
None
See application file for complete search history.

(56) References Cited

U.S. PATENT DOCUMENTS

| 6,894,474 B2* | 5/2005 | Cox | H01J 37/32935 324/464 |
| 2005/0188922 A1* | 9/2005 | Ishibashi | H01J 37/32935 118/723 I |
| 2005/0194094 A1* | 9/2005 | Yasaka | H01J 37/32935 156/345.28 |

(Continued)

FOREIGN PATENT DOCUMENTS

| JP | H6-68825 | 3/1994 |
| JP | 2004-055324 | 2/2004 |

(Continued)

*Primary Examiner* — Ram N Kackar
(74) *Attorney, Agent, or Firm* — Fenwick & West LLP (57) ABSTRACT

A plasma probe device includes an antenna unit installed at an opening formed in a wall of a processing chamber or a mounting table through a sealing member configured to seal between a vacuum space and an atmospheric space, an electrode connected to the antenna unit, and a dielectric support portion made of a dielectric material and configured to support the antenna unit from an outer peripheral side. A surface of the antenna unit which is exposed through the opening and separated from a facing surface of the wall or the mounting table facing the antenna unit by a width is depressed from a surface of the wall or the mounting table where the opening is formed, which faces a plasma generation space.

11 Claims, 10 Drawing Sheets

(56) References Cited

U.S. PATENT DOCUMENTS

2007/0075036 A1* 4/2007 Moroz .............. G01R 19/0061
216/59
2010/0258529 A1* 10/2010 Mori ................ H01J 37/32192
216/67
2011/0174777 A1* 7/2011 Jensen ............. H01J 37/32917
216/61

FOREIGN PATENT DOCUMENTS

| JP | 2005-277397 | 10/2005 |
| KR | 10-2008-0022142 A | 3/2008 |
| KR | 10-1756325 B1 | 7/2017 |

* cited by examiner

PLASMA PROBE DEVICE AND PLASMA PROCESSING APPARATUS

CROSS-REFERENCE TO RELATED APPLICATIONS

This application claims priority to Japanese Patent Application Nos. 2017-170114 and 2018-104108 respectively filed on Sep. 5, 2017 and May 30, 2018, the entire contents of which are incorporated herein by reference.

FIELD OF THE INVENTION

The present disclosure relates to a plasma probe device and a plasma processing apparatus.

BACKGROUND OF THE INVENTION

Conventionally, a plasma state is measured by inserting a probe for measuring a plasma state into a chamber and supplying a measuring power from a measuring power supply into the chamber (see, e.g., Japanese Patent Application Publication Nos. 2004-55324, 2005-277397, and H6-68825). For example, a probe disclosed in Japanese Patent Application Publication No. 2004-55324 includes an antenna for radiating a power, a coaxial cable for transmitting a measuring power, and a dielectric tube having a closed leading end. The antenna and the coaxial cable connected to each other are inserted into the dielectric tube. A behavior of the generated plasma is sensed by the probe.

In the conventional probe structure, the probe is disposed along a wall of a chamber or protrudes toward a plasma generation space beyond the wall of the chamber. Therefore, gas, a product generated during plasma processing, or the like is likely to enter a gap between the probe disposed to face the plasma generation space and the wall of the chamber, thereby generating particles.

Further, in the conventional probe structure, gas may enter the probe. Accordingly, the performance of the probe may deteriorate due to corrosion in the probe, and a film formation residue may be generated.

SUMMARY OF THE INVENTION

In view of the above, the present disclosure provides a plasma probe device for preventing intrusion of gas.

In accordance with an aspect, there is provided a plasma probe device including: an antenna unit installed at an opening formed in a wall of a processing chamber or a mounting table through a sealing member configured to seal between a vacuum space and an atmospheric space; an electrode connected to the antenna unit; and a dielectric support portion made of a dielectric material and configured to support the antenna unit from an outer peripheral side, wherein a surface of the antenna unit which is exposed through the opening and separated from a facing surface of the wall or the mounting table facing the antenna unit by a width is depressed from a surface of the wall or the mounting table where the opening is formed, which faces a plasma generation space.

Further, there is provided a plasma probe device including: a dielectric antenna unit; a dielectric antenna unit installed at an opening formed in a wall of a processing chamber or a mounting table through a sealing member configured to seal between a vacuum space and an atmospheric space; an electrode embedded in the antenna unit; and a dielectric support portion made of a dielectric material and configured to support the antenna unit from an outer peripheral side, wherein the electrode is provided inward of the opening.

In accordance with another aspect, there is provided a plasma processing apparatus including: a plurality of microwave radiation mechanisms configured to radiate microwaves outputted from an output unit of a microwave plasma source into a processing chamber; and a plasma probe device including: an antenna unit installed at an opening formed at a wall of a processing chamber or at a mounting table via a sealing member configured to seal between a vacuum space and an atmospheric space; an electrode connected to the antenna unit; and a dielectric support portion made of a dielectric material and configured to support the antenna unit from an outer peripheral side, wherein a surface of the antenna unit which is exposed through the opening and separated from a facing surface of the wall or the mounting table facing the antenna unit by a is depressed from a surface of the wall or the mounting table where the opening is formed, which faces a plasma generation space.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Hereinafter, embodiments will be described in detail with reference to the accompanying drawings. Like reference numerals will be given to substantially like parts throughout this specification and the drawings, and redundant description thereof will be omitted.

(Microwave Plasma Processing Apparatus)

Figure 1:
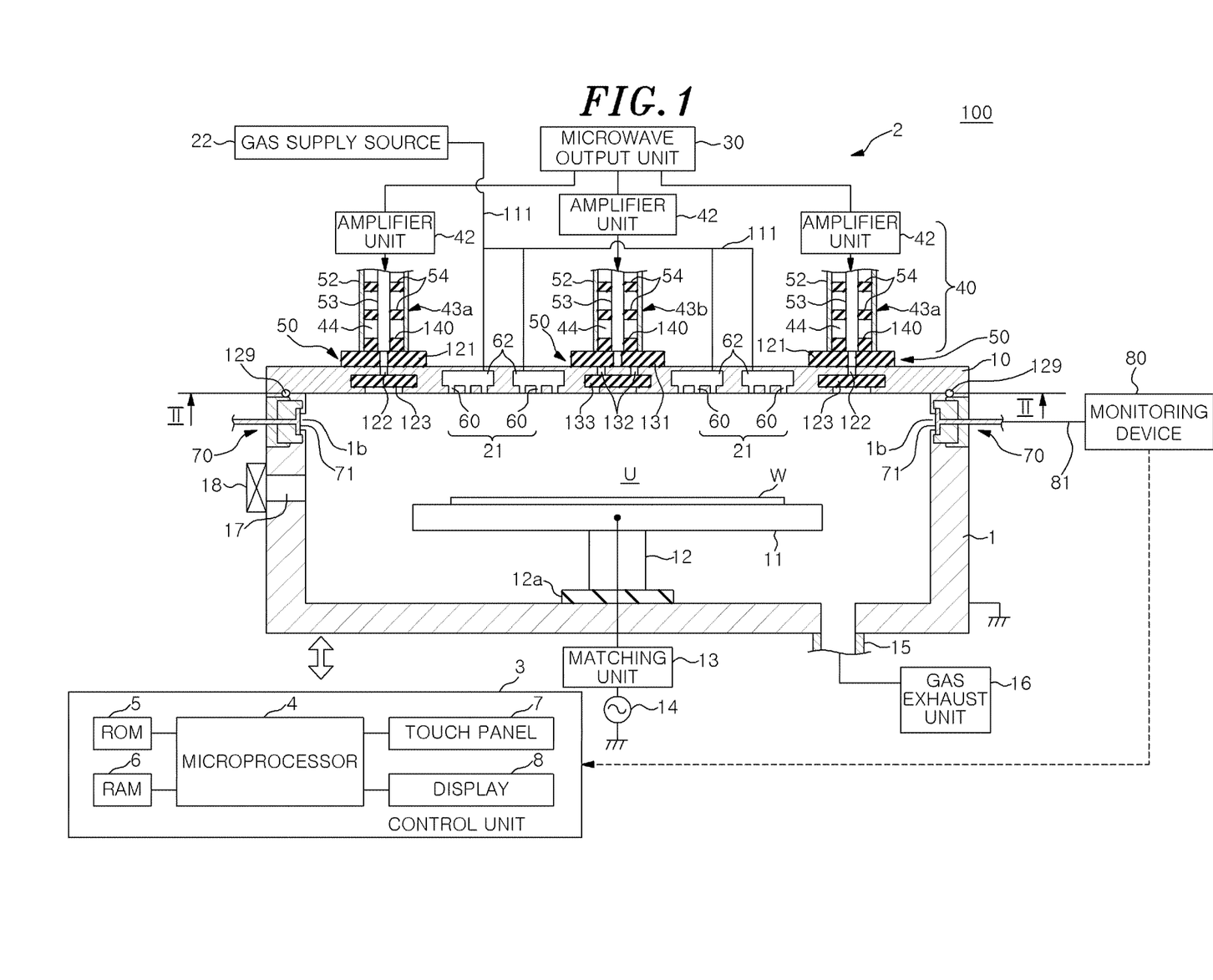
FIG. 1 shows an example of a microwave plasma processing apparatus according to an embodiment.

FIG. 1 shows an example of a cross sectional view of a microwave plasma processing apparatus 100 according to an embodiment. The microwave plasma processing apparatus 100 includes a processing chamber 1 for accommodating a semiconductor wafer W (hereinafter, referred to as "wafer").

The microwave plasma processing apparatus 100 is an example of a plasma processing apparatus for performing predetermined plasma processing on the wafer W by surface wave plasma formed on an inner wall surface of a ceiling portion of the processing chamber 1 by microwaves. The predetermined plasma processing may be film formation, etching, ashing, or the like.

The microwave plasma processing apparatus 100 includes the processing chamber 1, a microwave plasma source 2, and a control unit 3. The processing chamber 1 is a substantially cylindrical container made of a metal such as aluminum, stainless steel, or the like. The processing chamber 1 is airtight and grounded.

The processing chamber 1 has a main body 10 and defines a plasma processing space therein. The main body 10 is a disc-shaped ceiling plate constituting a ceiling portion of the processing chamber 1. A support ring 129 is provided on a contact surface between the processing chamber 1 and the main body 10. Accordingly, the inside of the processing chamber 1 is airtightly sealed. The main body 10 is made of a metal such as aluminum, stainless steel, or the like.

The microwave plasma source 2 includes a microwave output unit 30, a microwave transmission unit 40, and a microwave radiation mechanism 50. The microwave output unit 30 distributes and outputs microwaves to a plurality of channels. The microwave passes through the microwave transmission unit 40 and the microwave radiation mechanism 50 to be introduced into the processing chamber 1. The gas supplied into the processing chamber 1 is excited by an electric field of the introduced microwave, thereby generating surface wave plasma.

A mounting table 11 for mounting thereon the wafer W is provided in the processing chamber 1. The mounting table 11 is supported by a cylindrical supporting member 12 provided at a center of a bottom portion of the processing chamber 1 through an insulating member 12a. The mounting table 11 and the supporting member 12 may be made of a metal such as aluminum having an alumite treated (anodically oxidized) surface, an insulator (ceramic or the like) having therein a high frequency electrode. The mounting table 11 may be provided with an electrostatic chuck for attracting and holding the wafer W, a temperature control mechanism, a gas flow path for supplying a heat transfer gas to a backside of the wafer W, and the like.

A high frequency bias power supply 14 is connected to the mounting table 11 via a matching unit 13. By supplying a high frequency power from the high frequency bias power supply 14 to the mounting table 11, ions in the plasma are attracted to the wafer W. The high frequency bias power supply 14 may not be provided depending on characteristics of plasma processing.

A gas exhaust line 15 is connected to the bottom portion of the processing chamber 1. A gas exhaust unit 16 including a vacuum pump or the like is connected to the gas exhaust line 15. When the gas exhaust unit 16 is driven, the processing chamber 1 is exhausted and a pressure in the processing chamber 1 is decreased at a high speed to a predetermined vacuum level. A loading/unloading port 17 for loading/unloading the wafer W and a gate valve 18 for opening and closing the loading/unloading port 17 are provided at a sidewall of the processing chamber 1.

Figure 2:
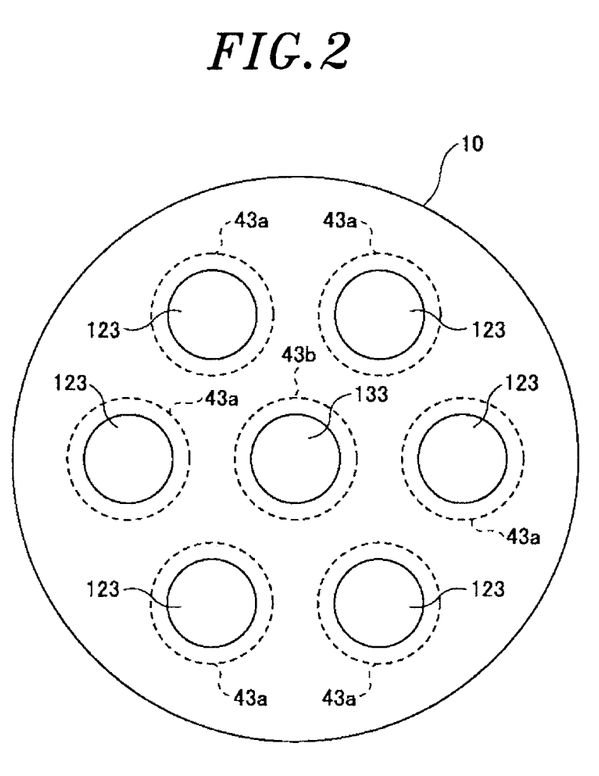
FIG. 2 shows an example of an inner wall of a ceiling portion of the microwave plasma processing apparatus according to the embodiment.

The microwave transmission unit 40 transmits the microwaves outputted from the microwave output unit 30. Referring to FIG. 2 showing a cross section taken along a line II-II of FIG. 1, a central microwave introducing mechanism 43b in the microwave transmission unit 40 is provided at the center of the main body 10 and six peripheral microwave introducing mechanisms 43a are arranged at a regular interval in a circumferential direction around the main body 10. The central microwave introducing mechanism 43b and the six peripheral microwave introducing mechanisms 43a have a function of introducing the microwaves outputted from corresponding amplifiers 42 shown in FIG. 1 to the microwave radiation mechanism 50 and a function of matching an impedance. Hereinafter, the peripheral microwave introducing mechanisms 43a and the central microwave introducing mechanism 43b are collectively referred to as "microwave introducing mechanism 43".

As shown in FIGS. 1 and 2, six dielectric layers 123 are disposed in the main body 10 below the six peripheral microwave introducing mechanisms 43a, respectively. In addition, one dielectric layer 133 is disposed in the main body 10 below the central microwave introducing mechanism 43b. The number of the peripheral microwave introducing mechanisms 43a and the number of the dielectric layers 123 are not limited to six but may be 2 or more. The number of the peripheral microwave introducing mechanisms 43a and the number of the dielectric layers 123 are preferably 3 or more, e.g., 3 to 6.

The microwave radiation mechanism 50 shown in FIG. 1 has a dielectric ceiling plate 121 or 131, slots 122 or 132, and a dielectric layer 123 or 133. The dielectric ceiling plates 121 and 131 are made of a disc-shaped dielectric material that transmits microwaves, and are disposed on a top surface of the main body 10. The dielectric ceiling plates 121 and 131 are made of a material whose relative dielectric constant is greater than that of vacuum, e.g., ceramic such as quartz, alumina ($Al_2O_3$) or the like, a fluorine-based resin such as polytetrafluoroethylene or the like, or a polyimide-based resin. Accordingly, a size of an antenna having the slots 122 or 132 can be reduced by making a wavelength of the microwave passing through the dielectric ceiling plate 121 or 131 shorter than a wavelength of the microwave propagating in the vacuum.

Under the dielectric ceiling plate 121 or 131, the dielectric layer 123 or 133 is in contact with a rear surface of an opening of the main body 10 with the slots 122 or 132 formed in the main body 10 interposed between the dielectric ceiling plates 121 or 131 and the dielectric layers 123 or 133, respectively. The dielectric layers 123 and 133 are made of, e.g., ceramic such as quartz, alumina ($Al_2O_3$) or the like, a fluorine-based resin such as polytetrafluoroethylene or the like, a polyimide-based resin, or the like. The dielectric layers 123 and 133 are provided at positions depressed from the ceiling surface by a distance corresponding to a thickness of the opening formed in the main body 10 and serve as dielectric windows for supplying microwaves to a plasma generation space U.

In each of the peripheral microwave introducing mechanisms 43a and the central microwave introducing mechanism 43b, a cylindrical outer conductor 52 and a rod-shaped inner conductor 53 inserted therein are coaxially arranged. A microwave transmission path 44, to which a microwave power is supplied and through which microwaves propagate toward the microwave radiation mechanism 50, is formed between the outer conductor 52 and the inner conductor 53.

Each of the peripheral microwave introducing mechanism 43a and the central microwave introducing mechanism 43b is provided with slugs 54 and an impedance control member 140 provided at a leading end thereof. An impedance of a load (plasma) in the processing chamber 1 is matched with a characteristic impedance of a microwave power supply in the microwave output unit 30 by moving the slug 54. The impedance control member 140 is made of a dielectric material and controls an impedance of the microwave transmission path 44 by a relative dielectric constant thereof.

A gas inlet 21 of a shower structure is formed in the main body 10. Gas is supplied from the gas supply source 22 into a gas diffusion space 62 through a gas supply line 111 and then supplied in a shower shape into the processing chamber 1 through the gas inlet 21. The gas inlet 21 is an example of a gas shower head for supplying gas through a plurality of gas supply holes 60 formed in the ceiling wall of the processing chamber 1. The gas may be a gas for plasma generation, e.g., Ar gas or the like, a gas to be decomposed by high energy, e.g., $O_2$ gas, $N_2$ gas or the like, or a processing gas, e.g., silane gas or the like.

The respective components of the microwave plasma processing apparatus 100 are controlled by the control unit 3. The control unit 3 includes a microprocessor 4, a ROM (Read Only Memory) 5, and a RAM (Random Access Memory) 6. The ROM 5 and the RAM 6 store therein a process sequence and a process recipe that is a control parameter of the microwave plasma processing apparatus 100. The microprocessor 4 controls the respective components of the microwave plasma processing apparatus 100 based on the process sequence and the process recipe. The control unit 3 includes a touch panel 7 and a display 8 and allows input, display of results or the like in performing a control based on the process sequence and the process recipe.

When plasma processing is performed in the microwave plasma processing apparatus 100 configured as described above, first, the wafer W held on a transfer arm is loaded into the processing chamber 1 through the opened gate valve 18 and the loading/unloading port 17. The gate valve 18 is closed after the wafer W is loaded. When the wafer W reaches a position above the mounting table 11, the wafer W is transferred from the transfer arm to pusher pins and then mounted on the mounting table 11 as the pusher pins are lowered. A pressure in the processing chamber 1 is maintained at a predetermined vacuum level by the gas exhaust unit 16. A processing gas is introduced in a shower shape into the processing chamber 1 through the gas inlet 21. The microwave radiated from the microwave radiation member 50 through the peripheral microwave introducing mechanism 43a and the central microwave introducing mechanism 43b propagates on the inner surface of the ceiling wall. The gas is excited by an electric field of the microwave propagating as a surface wave, and the wafer W is subjected to plasma processing by the surface wave plasma generated in the plasma generation space U below the ceiling wall on the processing chamber 1 side.

(Plasma Probe Device)

A plurality of openings 1b is formed at the sidewall of the processing chamber 1 in the circumferential direction, and a plurality of plasma probe devices 70 is installed thereat. Only one plasma probe device 70 may be installed at the processing chamber 1. The plasma probe device 70 senses plasma generated in the plasma generation space U. A plasma electron temperature $T_e$ and/or a plasma electron density $N_e$ are calculated based on the sensing result. Accordingly, the behavior of the plasma can be estimated.

The plasma probe device 70 is connected to a monitoring device 80 outside the microwave plasma processing apparatus 100. The monitoring device 80 has a signal transmitter and outputs a signal having a predetermined frequency which is transmitted by a signal transmitter. The signal is transmitted through the coaxial cable 81 to the plasma probe device 70. Then, the signal is transmitted from an antenna unit 71 provided at a leading end of the plasma probe device 70 to the plasma.

The plasma probe device 70 detects a current value of a signal reflected from the plasma side with respect to a signal transmitted to the plasma side and transmits the detected current value to the monitoring device 80. The detected current value of the signal is transmitted from the monitoring device 80 to the control unit 3, and FFT (frequency) analysis is performed by the microprocessor 4 of the control unit 3. Accordingly, the plasma electron temperature $T_e$ and/or the plasma electron density $N_e$ are calculated.

(Configuration of Plasma Probe Device)

Figure 3:
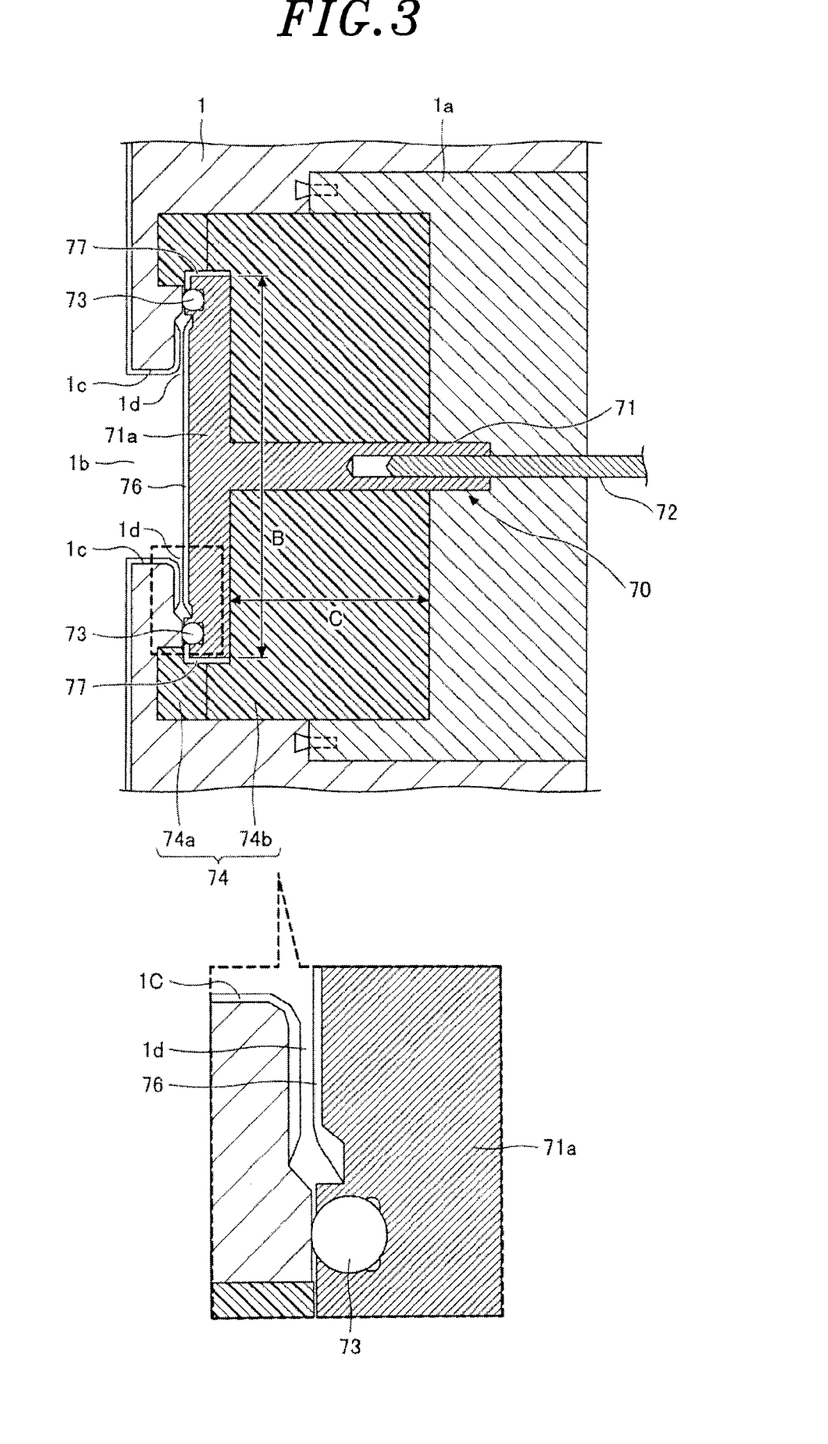
FIG. 3 shows an example of a configuration of a plasma probe device according to an embodiment.

Next, an example of the configuration of the plasma probe device 70 will be described with reference to FIG. 3. FIG. 3 shows an example of the configuration of the plasma probe device 70 according to an embodiment. The plasma probe device 70 includes an antenna unit 71 installed at the opening 1b formed in the sidewall of the processing chamber 1 through an O-ring 73, an electrode 72 connected to the antenna unit 71, and a dielectric support portion 74 for supporting the antenna unit 71.

The antenna unit 71 is provided at the leading end of the plasma probe device 70. In the present embodiment, the leading end of the antenna unit 71 is a disc-shaped member 71a and blocks the opening 1b through the O-ring 73. The O-ring 73 is made of a dielectric material such as resin or the like. The leading end of the antenna unit 71 does not necessarily have a disc shape, and may have, e.g., a rectangular shape.

A lower part of FIG. 3 shows an enlarged view of facing surfaces of the antenna unit 71 (disc-shaped member 71a) and the wall of the processing chamber 1 which are in the vicinity of the O-ring 73. A front end surface of the antenna unit 71 and the rear surface of the wall of the processing chamber 1, which are in the vicinity of the opening 1b, are separated from each other to form a gap 1d having a width therebetween.

If the gap 1d is not formed between the front end surface of the antenna unit 71 and the wall of the processing chamber 1, the antenna unit 71 is connected to the wall of the processing chamber 1 in a DC manner. In that case, the current of the signal transmitted from the monitoring device 80 flows to the wall of the processing chamber 1, and a ratio of the current flowing in the plasma is decreased. As a consequence, the antenna unit 71 does not function as the antenna of the plasma probe device 70. Therefore, the gap 1d having a width is formed between the front end surface of the antenna unit 71 and the rear surface of the wall of the processing chamber 1 which are in the vicinity of the opening 1b. The current of the signal flowing from the antenna unit 71 to the wall of the processing vessel 1 is referred to as "stray current".

Even if the AC current flows toward the wall of the processing chamber 1, the antenna unit 71 functions as the antenna of the plasma probe device 70. In order to increase the sensitivity of the plasma probe device 70, it is preferable to prevent a stray current including the AC current as well as a DC current from flowing toward the wall of the processing chamber 1.

If the gap 1d is too wide, gas or plasma enters the gap 1d, thereby causing problems of corrosion due to plasma, particles generated by intrusion of gas, and abnormal discharge. Therefore, the gap 1d is designed to be wide enough to prevent the antenna unit 71 and the wall of the processing chamber 1 from being connected in a DC manner and narrow enough to prevent intrusion of plasma or gas.

The antenna unit 71 is disposed at a position depressed from the inner wall surface of the processing chamber 1 where the opening 1b is formed. The surface of the antenna unit 71 is exposed to the plasma generation space U at the position depressed from the inner wall surface. By depressing the surface of the antenna unit 71, the position where the gap 1d between the antenna unit 71 and the wall of the processing chamber 1, which is a particle generation source, becomes far from the wafer W. Accordingly, the generation of particles and the intrusion of gas into the plasma probe device 70 are prevented, thereby reducing the influence of particles on the characteristics of the plasma processing and decreasing corrosion of the plasma probe device 70 due to the plasma. Further, by depressing the surface of the antenna unit 71 without positioning the surface of the antenna unit 71 at the same height as that of the inner wall surface of the processing chamber 1, it is possible to suppress occurrence of mode jump of the surface wave plasma propagating on the inner wall surface of the processing chamber 1 and avoid abnormal discharge.

At least a region from the opening 1b to the O-ring 73 on the surface (front end surface) of the antenna unit 71 is covered with an insulating film 76 by thermal spraying of $Y_2O_3$. At least a region from the side surface of the opening 1b to the O-ring 73 through the rear surface of the opening 1b on the wall surface of the processing chamber 1 is covered with an insulating film 1c by thermal spraying of $Y_2O_3$.

Accordingly, it is possible to prevent the DC current from flowing from the antenna unit 71 toward the wall of the processing chamber 1. In addition, the plasma resistance can be enhanced. When the surface of the antenna unit 71 which is closer to the atmosphere side than the O-ring 73 or the inner wall surface of the processing chamber 1 is coated with an insulating film 77, the plasma resistance is improved, which is more preferable. The insulating films 76, 77 and 1c may be formed by alumite processing.

The O-ring 73 seals between the vacuum space on the side of the opening 1b and the atmosphere space on the side where the plasma probe device 70 is installed. The O-ring 73 is an example of a sealing member for sealing the gap between the vacuum space and the atmosphere space.

In the present embodiment, by pressing the O-ring 73 against the rear surface of the wall of the processing chamber 1 which is in the vicinity of the opening 1b at the front end surface of the antenna unit 71, the sealing is made between the vacuum space and the atmospheric space, and it is difficult for gas to enter the gap between the antenna unit 71 and the wall of the processing chamber 1. Accordingly, the generation of particles can be reduced.

If a corrosive gas enters the gap between the antenna unit 71 and the wall of the processing chamber 1, the antenna unit 71 is corroded and the performance of the plasma probe device 70 deteriorates. Therefore, when the plasma probe device 70 is installed at the opening 1b of the processing chamber 1, vacuum sealing using the O-ring 73 is performed near the opening 1b so that gas does not enter the plasma probe device 70.

As the opening 1b becomes wider, a ratio of the current of the signal transmitted from the monitoring device 80 which flows to the plasma without becoming a stray current is increased and, thus, the sensitivity of the antenna unit 71 is improved. On the other hand, as the opening 1b becomes wider, the plasma or the gas is more likely to enter the antenna unit 71. Accordingly, the antenna unit 71 is corroded by a corrosive gas or plasma, which may result in deterioration of the performance of the plasma probe device 70 or occurrence of abnormal discharge. If the sensitivity of the plasma probe device 70 is excessively high, the measurement result of the plasma probe device 70 is affected by temporal changes in the processing chamber 1, such as adhesion of reaction products generated by the plasma processing to the surface of the plasma probe device 70 or the like. Accordingly, the plasma state may not be measured with high accuracy. Therefore, the opening 1b is designed to have an appropriate dimension that allows the plasma state to be accurately measured while considering the sensitivity of the antenna unit 71 and the intrusion of gas or plasma. The opening 1b may have a circular shape, a rectangular shape, or another shape.

The electrode 72 is inserted into the antenna unit 71 to measure a current value indicating the plasma state and transmits the measured value to the monitoring device 80. The dielectric support portion 74 is made of PTFE (polytetrafluoroethylene). The dielectric support portion 74 is an example of a fixing member that surrounds the antenna unit 71 and fixes the antenna unit 71 and the O-ring 73. The dielectric support portion 74 is fixed by securing a member 1a made of a metal such as aluminum or the like to the wall of the processing chamber 1 by screws in a state where the antenna unit 71 and the O-ring 73 are fixed to the vicinity of the opening 1b.

In the present embodiment, the dielectric support portion 74 is divided into two dielectric support parts 74a and 74b. However, the present disclosure is not limited thereto, the dielectric support portion may be formed as one unit. For example, the dielectric support portion 74 may include only the dielectric support part 74a for fixing the disc-shaped member 71a of the antenna unit 71 from the outer peripheral side. In that case, the antenna unit 71, the dielectric support part 74a and the O-ring 73 are fixed by the member 1a. In that case, the dielectric support portion 74a may be a space or may be filled with PTFE.

A ratio of a length C in a depth direction of the dielectric support portion 74 to a diameter B of the disc-shaped member 71a in FIG. 3 is set to about ½, specifically, any value within a range from 0.44 to 0.54. If the diameter B and the length C are small or the ratio thereof is not appropriate, the current from the electrode 72 does not reach the plasma through the antenna unit 71, and the sensitivity becomes poor. Therefore, the plasma probe device 70 having high sensitivity can be provided by setting the length B and the length C to a predetermined range.

In order to improve the sensitivity of the plasma probe device 70, it is required to minimize the stray current flowing from the antenna unit 71 to the wall of the processing chamber 1. In other words, as the ratio of the current flowing in the plasma to the stray current is increased, the sensitivity of the plasma probe device 70 is improved. Therefore, in order to increase the ratio of the current flowing in the plasma to the stray current, it is preferable to increase a surface area of the antenna unit 71 which is exposed through the opening 1b.

Therefore, in the present embodiment, at least one of a recess or a protrusion may be formed at a region of the front end surface of the antenna unit 71 which is exposed through the opening 1b. Alternatively, the front end surface of the antenna unit 71 may be curved in a recessed shape or in a protruded shape. In this way, the surface area of the antenna unit 71 can be increased. As a result, even when the signal of the same power is transmitted from the monitoring device 80, the current flowing in the plasma can be increased, and the sensitivity of the plasma probe device 70 can be improved.

(Arrangement of Plasma Probe Device)

Figure 4:
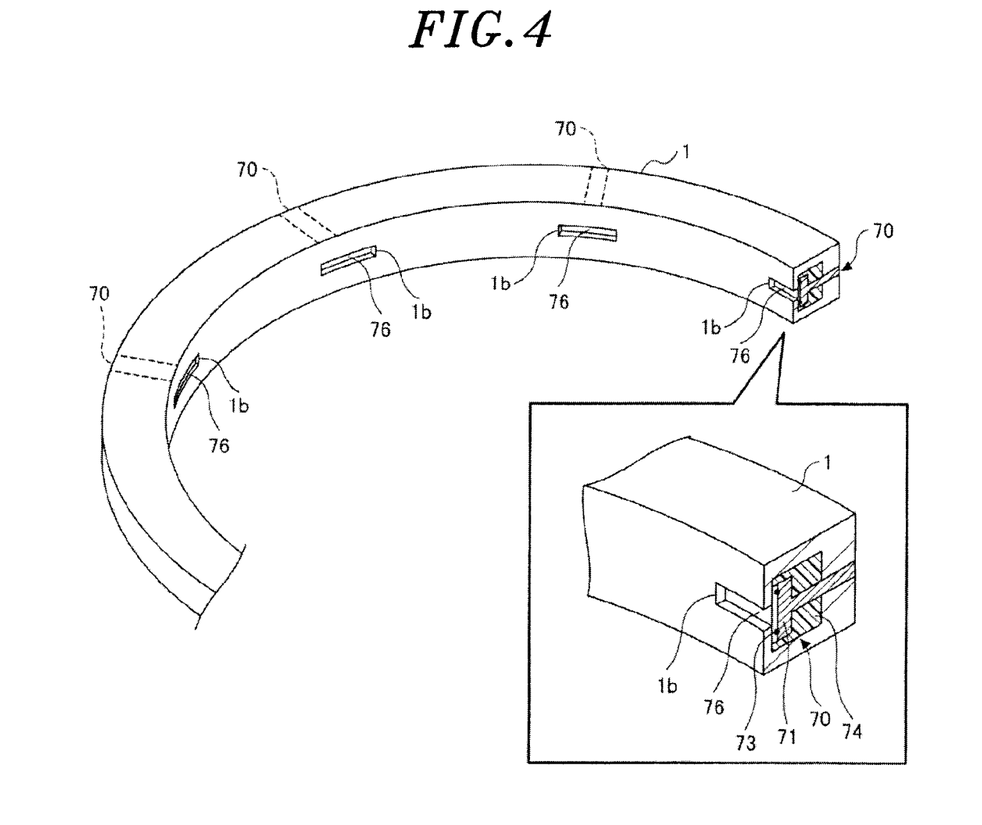
FIG. 4 shows an example of an arrangement of the plasma probe device according to the embodiment.

Next, an example of the arrangement of the plasma probe device 70 will be described with reference to FIG. 4. FIG. 4 shows an example of the arrangement of the plasma probe device 70 with respect to the microwave plasma processing apparatus 100 of the present embodiment. In the microwave plasma processing apparatus 100 of the present embodiment, a part of the sidewall of the processing chamber 1 is separated in a ring shape; a plurality openings 1b is formed at a regular interval in a circumferential direction thereof; and the plasma probe device 70 is installed at each opening 1b through the O-ring 73. An insulating film 76, which is made of $Y_2O_3$ and coated on the antenna unit 71, is exposed through the openings 1b to the plasma generation space. The openings 1b may be a plurality of slits provided at the wall of the processing chamber 1. The opening 1b may be formed at the sidewall of the processing chamber 1 without separating the sidewall in a ring shape.

In the present embodiment, the openings 1b are formed in the circumferential direction of the sidewall of the processing chamber 1, and the plasma probe device 70 is installed at each opening 1b by pressing the antenna unit 71 against each opening 1b through the O-ring 73 by the dielectric support part 74. However, the plasma probe device 70 is not necessarily installed at the sidewall of the processing chamber 1, and may be installed at at least one of the ceiling wall of the processing chamber 1 and the outer peripheral portion of the mounting table 11.

Figure 5:
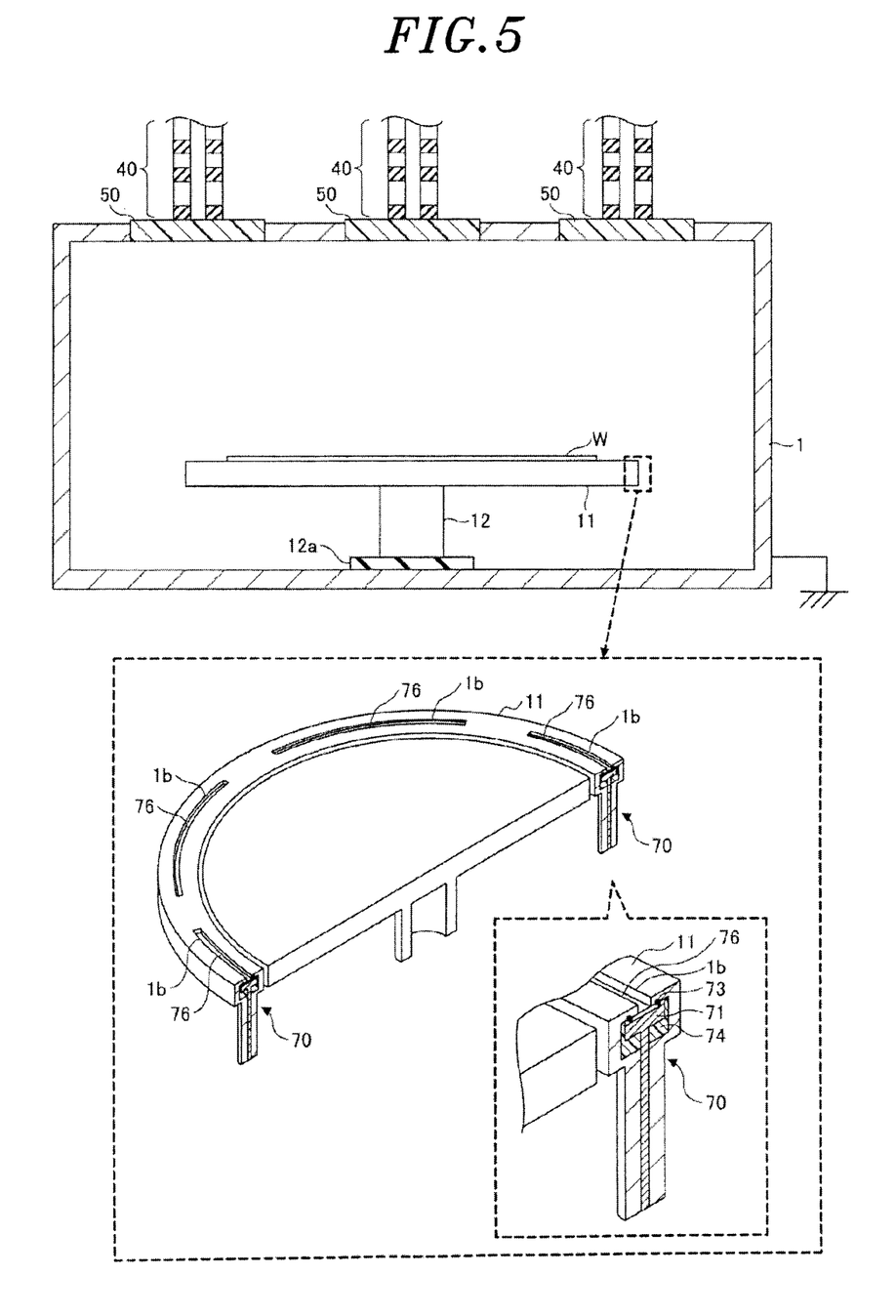
FIG. 5 shows another example of the arrangement of the plasma probe device according to the embodiment.

For example, as shown in FIG. 5, a plurality of openings 1b may be formed at a regular interval at the outer peripheral portion of the mounting table 11 in the circumferential direction thereof, and a plurality of plasma probe devices 70 may be installed at the plurality of openings 1b.

A plurality of openings 1b may be formed at the ceiling wall of the processing chamber 1, i.e., at the main body 10, in the circumferential direction thereof, and a plurality of plasma probe devices 70 may be installed at the plurality of openings 1b. When the plasma probe device 70 is installed at the ceiling wall, the insulating film coated on the antenna unit 71 may be made of $Al_2O_3$ instead of $Y_2O_3$.

(Measurement of Plasma Probe Device)

Figure 6:
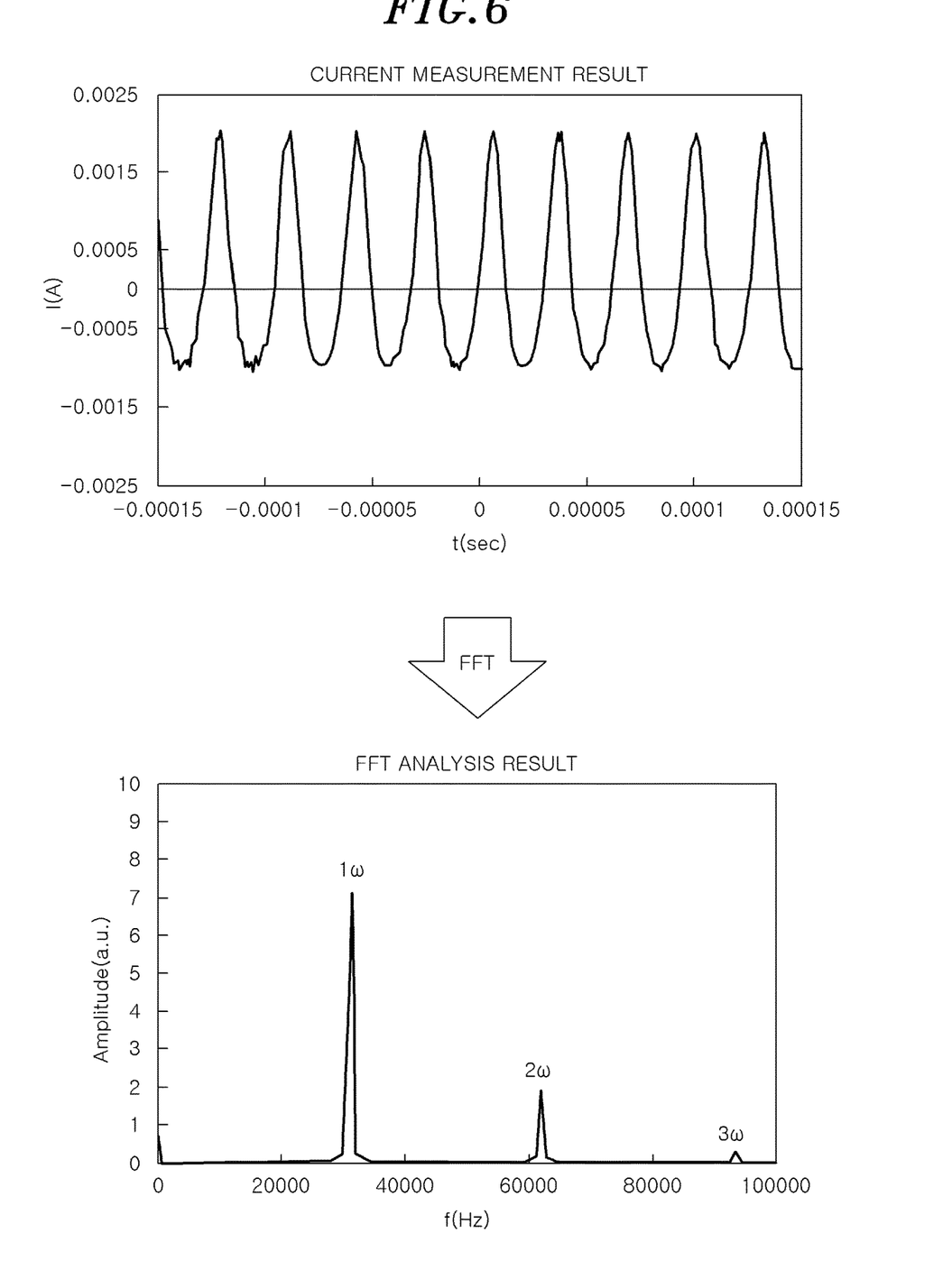
FIG. 6 shows an example of a measurement result obtained by the plasma probe device according to the embodiment.

FIG. 6 shows an example of the measurement result of the state of plasma generated in the microwave plasma processing apparatus 100 which is obtained by the plasma probe device 70 of the present embodiment. A current value I shown in the graph of the current measurement result on the upper part of FIG. 6 is transmitted from the plasma probe device 70 to the control unit 3 via the monitoring device 80, and subjected to FFT (Fourier transform) by the microprocessor 4 of the control unit 3. Accordingly, as shown in the graph on the lower part of FIG. 6, the current value is converted into amplitude components for each frequency.

In the plasma, a current flows exponentially with respect to a voltage. The measured current value includes a component of a fundamental wave having a fundamental frequency and a component of a harmonic wave such as a first harmonic wave having a wavelength that is twice as long as that of the fundamental wave, a second harmonic wave having a wavelength that is three times as long as that of the fundamental wave, and the like. Therefore, the plasma electron density and the plasma electron temperature can be calculated by using amplitude peaks of the fundamental wave and the harmonic wave by FFT. "1ω" in the graph after the FFT indicates the component of the fundamental wave; "2ω" indicates the component of the first harmonic wave; and "3ω" indicates the component of the second harmonic wave.

(Measurement of Plasma Electron Density $N_e$/Plasma Probe Device)

The control unit 3 calculates the plasma electron density $N_e$ and the plasma electron temperature $T_e$ by using the amplitudes of the fundamental wave and the harmonic wave after the FFT of the current value measured by the plasma probe device 70. An example of the calculation method will be briefly described. When an AC current is applied to the electrode 72 of the plasma probe device 70, a probe current $i_{pr}$ shown in Eq. (1) flows in the antenna unit 71.

$$i_{pr} = \frac{1}{4} en_s \bar{u}_e A \, \exp\left(\frac{V_{Bias} - \Phi_p}{T_e}\right) - en_s u_B A = \qquad (1)$$
$$\frac{1}{4} en_s \bar{u}_e A \, \exp\left[\frac{(V_{dc} + V_0 \cos \omega t) - \Phi_p}{T_e}\right] - en_s u_B A$$

Here, e indicates an elementary charge, and $n_s$ indicates an electron density of a plasma sheath surface, $\bar{u}_e$ indicates an average speed of electrons, A indicates an area in contact with the plasma of the antenna unit 71 (i.e., an area of the opening 1b), $V_{Bias}$ indicates a voltage applied to the probe, $\Phi_p$ indicates a plasma potential, $T_e$ indicates an electron temperature of the plasma, $u_B$ indicates a Bohm velocity, $V_{dc}$ indicates a self-bias voltage, and $V_0$ indicates an AC voltage (e.g., 4V to 5V) applied from the monitoring device 80 to the plasma probe device 70.

Eq. (1) is transformed by using a first modified Bessel function $I_k$, and the probe current $i_{pr}$ is separated into a DC component and an AC component as shown in Eq. (2).

$$i_{pr} = \frac{1}{4} en_s \bar{u}_e A \, \exp\left(\frac{V_{dc} - \Phi_p}{T_e}\right) I_0\left(\frac{V_0}{T_e}\right) - \qquad (2)$$
$$en_s u_B A + \frac{1}{2} en_s \bar{u}_e A \, \exp\left(\frac{V_{dc} - \Phi_p}{T_e}\right) \sum_{k=1}^{\infty} I_k\left(\frac{V_0}{T_e}\right) \cos(k\omega t)$$

The upper term of the right side of the Eq. (2) is the DC component of the probe current $i_{pr}$ and the lower term of the right side of the Eq. (2) is the AC component of the probe current $i_{pr}$ obtained by multiplying cos(kωt) by a variable. The DC component of the probe current $i_{pr}$ indicates the DC current flowing between the antenna unit 71 and the plasma. In the configuration of the plasma probe device 70 according to the present embodiment, the antenna unit 71 and the coaxial cable 81 are not connected in a DC manner by the blocking capacitor and, thus, the DC component of the probe current $i_{pr}$ of the Eq. (2) is 0. As a result, Eq. (3) is derived.

$$i_{pr} = \frac{1}{2} en_s \bar{u}_e A \, \exp\left(\frac{V_{dc} - \Phi_p}{T_e}\right) \sum_{k=1}^{\infty} I_k\left(\frac{V_0}{T_e}\right) \cos(k\omega t) \qquad (3)$$

Eq. (4) is obtained by developing Eq. (3) by Fourier series.

$$|i_{1\omega}|/|i_{2\omega}| = I_1\left(\frac{V_0}{T_e}\right) / I_2\left(\frac{V_0}{T_e}\right) \qquad (4)$$

The left side of the Eq. (4) is an actually measured value and shows a ratio of an amplitude of the current $i_{1\omega}$ of the fundamental wave (1ω) to an amplitude of the current i₂, of the first harmonic wave (2ω).

The right side of the Eq. (4) shows a ratio of the fundamental wave to the first harmonic wave in the case of developing the probe current by the first modified Bessel function.

Therefore, the plasma electron temperature $T_e$ can be calculated from the ratio of the amplitude of the fundamental wave (1ω) to the amplitude of the first harmonic wave (2ω), which is calculated from the Eq. (4) by the FFT, and the ratio of the actually measured values. $V_0$ is a monitor voltage (e.g., 4V).

Further, the DC component of the current $i_{1\omega}$ in the fundamental wave (1ω) is shown in Eq. (5). The DC component of the current $i_{1\omega}$ which is shown in Eq. (5) is 0.

$$\frac{1}{4}en_s\bar{u}_e A \, \exp\left(\frac{V_{dc}-\Phi_p}{T_e}\right)I_0\left(\frac{V_0}{T_e}\right) - en_s u_B A = 0 \quad (5)$$

The AC component of the current $i_{1\omega}$ is shown in Eq. (6).

$$i_{1\omega} = \frac{1}{2}en_s\bar{u}_e A \, \exp\left(\frac{V_{dc}-\Phi_p}{T_e}\right)I_1\left(\frac{V_0}{T_e}\right)\cos \omega t \quad (6)$$

The ion density $n_i$ in the plasma is calculated by substituting an absolute value of the current $i_{1\omega}$ in the fundamental wave (1ω) calculated by the Eq. (6) into Eq. (7). The ion density $n_i$ is equal to the plasma electron density $N_e$. In this manner, the plasma electron density $N_e$ is calculated.

$$n_i = \frac{|i_{1\omega}|}{2(0.61eu_B A)}\frac{I_0(V_0/T_e)}{I_1(V_0/T_e)} \quad (7)$$

Figure 7:
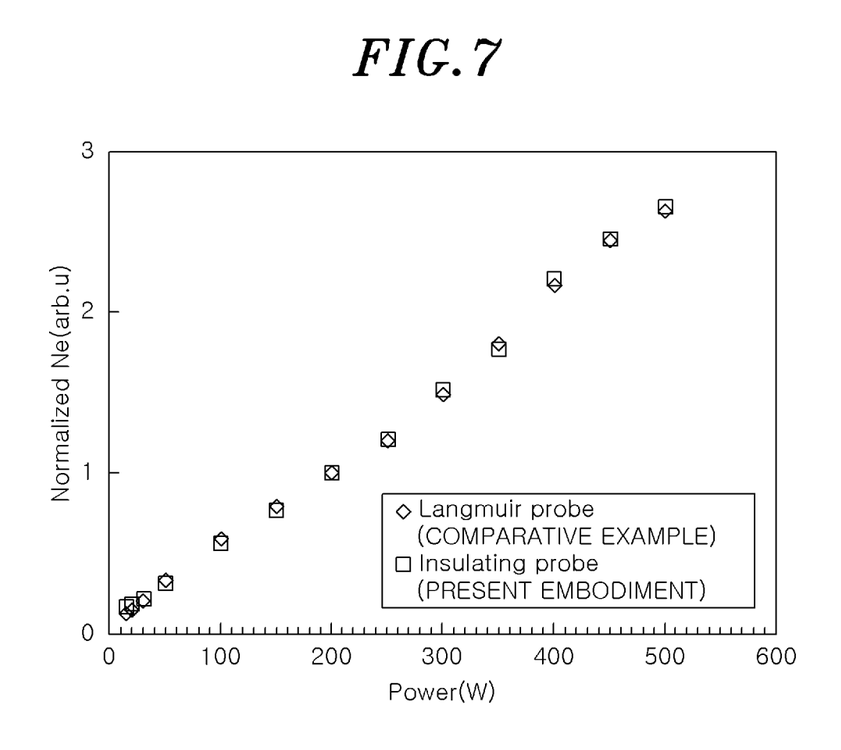
FIG. 7 shows an example of power dependency of a plasma electron temperature measured by a probe according to an embodiment.

The graph of FIG. 7 is an example of a comparison result between the power dependency of the plasma electron density $N_e$ measured by the plasma probe device 70 of the present embodiment and the power dependency of the plasma electron density $N_e$ measured by a Langmuir probe of a comparative example. According to this graph, the power dependency of the plasma electron density $N_e$ measured by the plasma probe device 70 of the present embodiment is substantially the same as that measured by the Langmuir probe.

Figure 8:
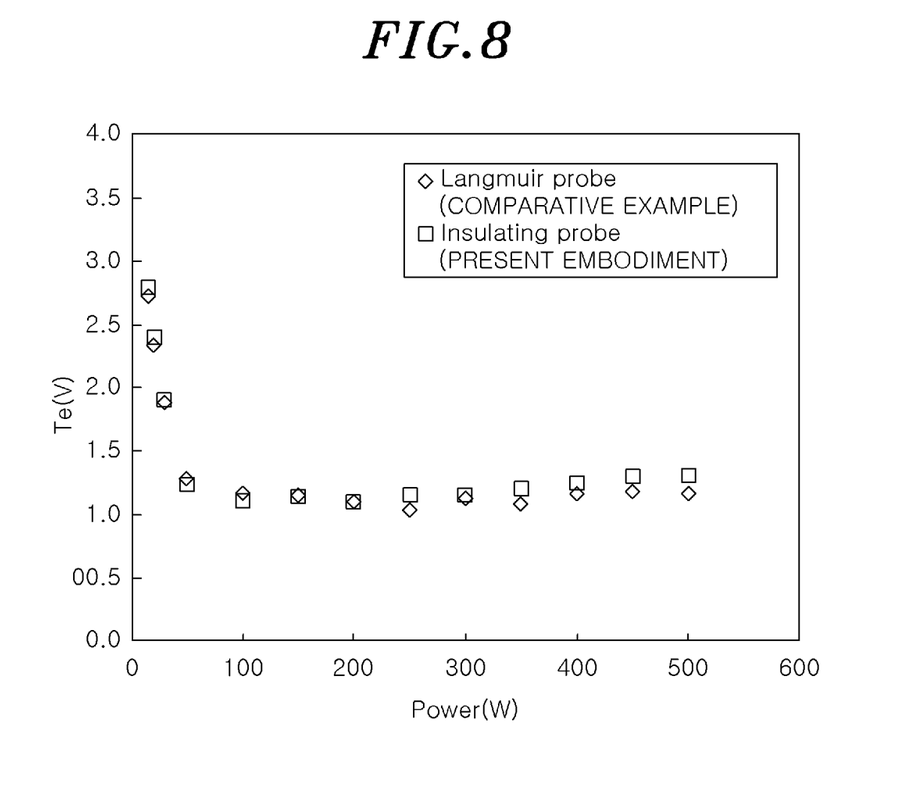
FIG. 8 shows an example of power dependency of a plasma electron density measured by the probe according to the embodiment.

The graph of FIG. 8 is an example of a comparison result between the power dependency of the plasma electron temperature $T_e$ measured by the plasma probe device 70 of the present embodiment and the power dependency of the plasma electron temperature $T_e$ measured by the Langmuir probe of the comparative example. According to this graph, the power dependency of the plasma electron temperature $T_e$ measured by the plasma probe device 70 of the present embodiment is substantially the same as that measured by the Langmuir probe.

In other words, the electrical characteristics of the plasma which are measured by the plasma probe device 70 of the present embodiment are substantially the same as those measured by the Langmuir probe, and the plasma probe device 70 of the present embodiment functions similarly to the Langmuir probe. An example of the measurement of the electrical characteristics of the plasma by the Langmuir probe is disclosed in Japanese Patent Application Publication No. 2009-194032.

As described above, in accordance with the plasma probe device 70 of the present embodiment, there is provided the antenna structure having the gap 1d which can avoid intrusion of gas into the plasma probe device 70 and prevent generation of the stray current. Accordingly, it is possible to improve the measurement sensitivity and perform highly reliable plasma measurement probe device stray current. Further, by providing a structure that does not allow intrusion of gas, it is possible to decrease corrosion of the plasma probe device 70 and avoid deterioration of the performance of the plasma probe device 70.

(Modification)

If a noise with respect to the current flowing between the antenna unit 71 and the plasma which is measured by the plasma probe device 70 is large, the accuracy of the remaining signals except the noise components deteriorates. For example, as the stray current is increased, the measurement sensitivity and the accuracy of the signal measured by the plasma probe device 70 deteriorate.

The O-ring 73 can be electrically considered as a capacitance. When the metals between the sidewall of the processing chamber 1 and the leading end of the antenna unit 71 are separated by the O-ring 73 and prevented from being electrically connected, the metals become closer when the sealing is made between the vacuum space and the atmospheric space and the leakage current (stray current) is increased. Accordingly, the measurement sensitivity and measurement accuracy of the plasma probe device 70 may not be sufficiently obtained.

Therefore, in the plasma probe device 70 according to the modification, the stray current is hardly generated. The plasma probe device 70 according to the modification will be described with reference to FIGS. 9A, 9B, 10A and 10B.

Figure 9A:
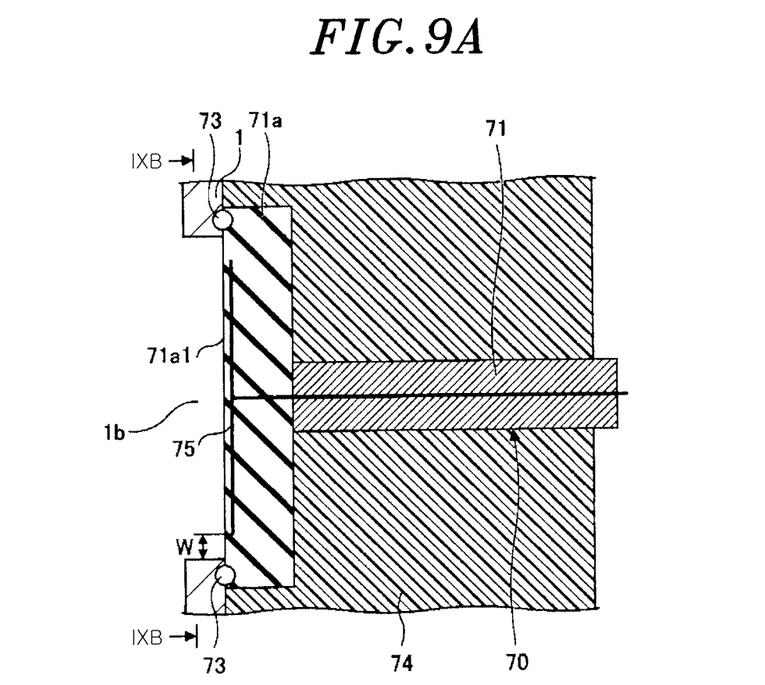
FIGS. 9A and 9B show an example of a configuration of a plasma probe device according to a modification.

As shown in FIG. 9A, the plasma probe device 70 according to the modification includes an antenna unit 71, an electrode 75, and a dielectric support portion 74. The antenna unit 71 is attached to an opening 1b formed at the sidewall of the processing chamber 1 via an O-ring 73. The electrode 75 is buried in a disc-shaped member 71a at the leading end of the antenna unit 71. The dielectric support portion 74 supports the antenna unit 71 from an outer peripheral side.

In the plasma probe device 70 according to the modification, the disc-shaped member 71a at the leading end of the antenna unit 71 is made of a dielectric material. The disc-shaped member 71a may be made of ceramic such as alumina or the like. Therefore, the electrode 75 is buried in the disc-shaped member 71a made of ceramic without being exposed, at a position near a surface 71a1 of the disc-shaped member 71a that is exposed through the opening 1b. Since the electrode 75 is not exposed through the opening 1b, contamination can be prevented.

Further, in the plasma probe device 70 according to the modification, no gap is provided between the sidewall of the processing chamber 1 where the O-ring 73 is disposed and the disc-shaped member 71a. This is because the sidewall of the processing chamber 1 is made of metal and the disc-shaped member 71a is made of ceramic and, thus, they are not electrically connected. Accordingly, it is possible to obtain a state in which the sidewall of the processing chamber 1 and the disc-shaped member 71a are not electrically connected without providing a gap. As a result, the stray current hardly leaks from the vicinity of the O-ring 73, and the measurement sensitivity and the accuracy of the plasma probe device 70 can be improved.

In order to increase the measurement sensitivity of the plasma probe device 70, it is preferable to maximize the area of the electrode 75. In order to obtain a desired probe characteristic, it is preferable to prevent the electrode 75 and the metal on the sidewall of the processing chamber 1 from overlapping with each other.

Figure 9B:
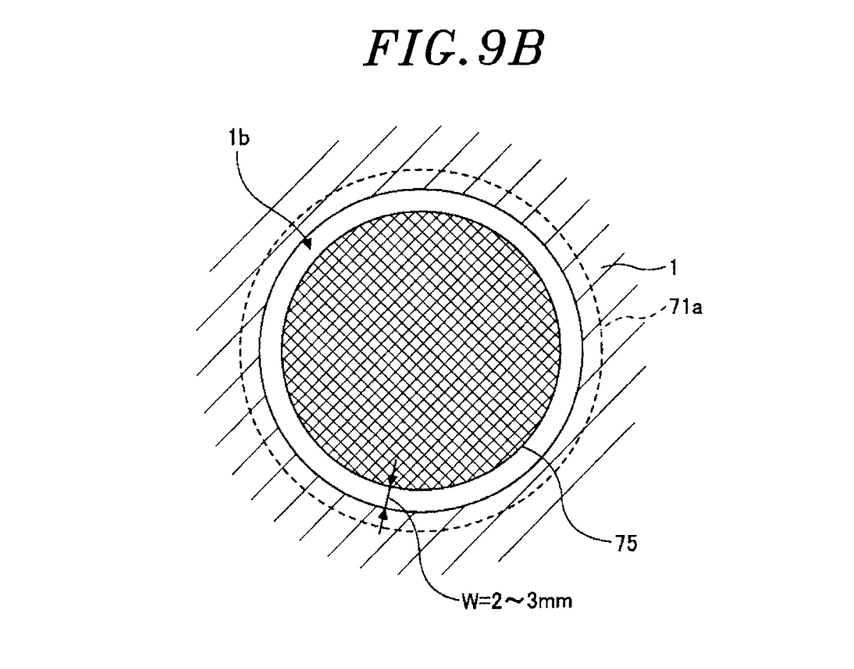

Therefore, as shown in FIG. 9B that is a cross sectional view taken along a IXB-IXB plane in FIG. 9A, the electrode 75 is preferably formed in a circular shape separated from the edge of the opening 1b by a distance W of about 2 to 3 mm. The electrode 75 is preferably formed in a mesh shape.

The opening 1b does not necessarily have a circular shape, and may have a rectangular shape or another shape. It is preferable that the shape of the electrode 75 is identical or similar to that of the opening 1b. In other words, the electrode 75 is preferably formed in a rectangular shape if the opening 1b is formed in a rectangular shape. Further, it is preferable that the electrode 75 is provided inward of the opening 1b to be separated from the opening 1b by 2 mm or more.

With this configuration, the electrostatic capacitance between the plasma probe device 70 and the wall of the processing chamber 1 can be decreased, and the stray current can be considerably decreased. Further, since the surface 71a1 of the disc-shaped member 71a exposed through the opening 1b is made of ceramic, the resistance to corrosion by the processing gas can be improved. Therefore, it is not necessary to coat an $Y_2O_3$ film or the like on the surface 71a1 of the disc-shaped member 71a exposed through the opening 1b. In addition, with this configuration, the possibility of occurrence of abnormal discharge between the metal on the sidewall of the processing chamber 1 and the ceramic of the disc-like member 71a can be considerably reduced. The electrode 75 can be buried in the disc-shaped member 71a made of ceramic and sintered as one unit.

The surface 71a1 of the disc-shaped member 71a may be depressed from a surface of the wall, on which the opening 1b is formed, facing the plasma generation space. Further, the surface 71a1 may be curved convexly or concavely.

Figure 10A:
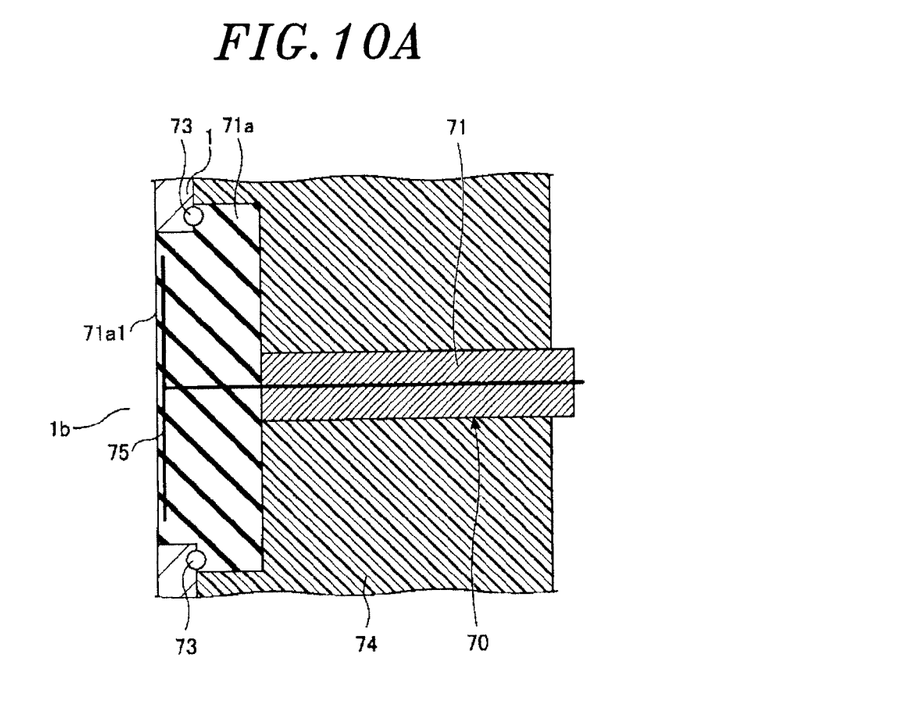
FIGS. 10A and 10B show the example of the configuration of the plasma probe device according to the modification.
Figure 10B:
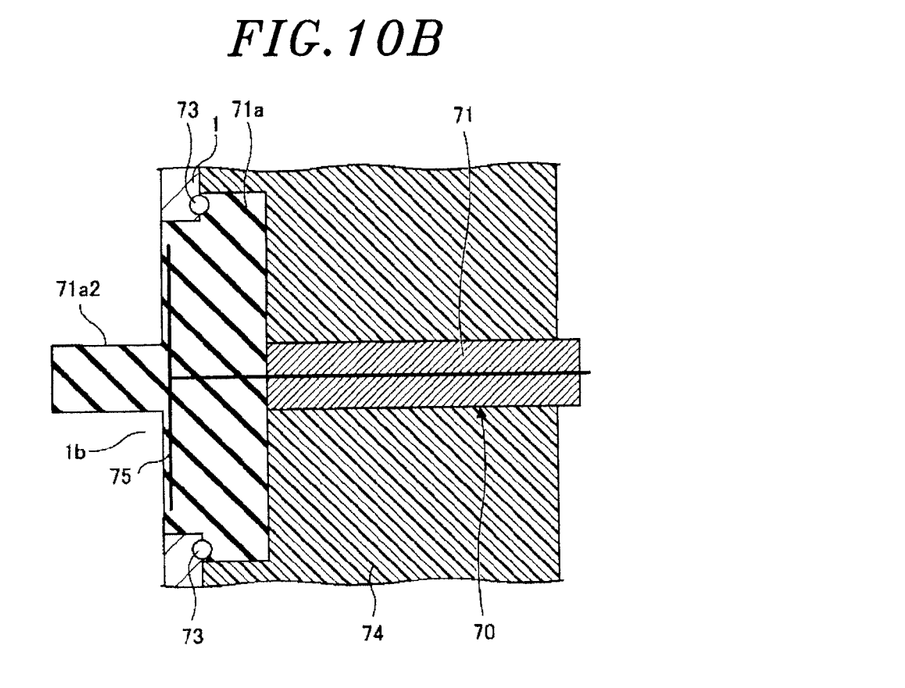

As shown in FIG. 10A, the surface 71a1 of the disc-shaped member 71a may be flush with the wall surface of the processing chamber 1 where the opening 1b is formed. Further, as shown in FIG. 10B, the disc-shaped member 71a may be provided with a protrusion 71a2 protruding from the opening 1b. Accordingly, the measurement sensitivity and the accuracy of the plasma probe device 70 can be improved. Since the disc-shaped member 71a is made of ceramic, even if the protrusion 71a2 is provided, the possibility of occurrence of abnormal discharge is extremely low.

While the embodiments of the plasma probe device and the plasma processing apparatus have been described, the plasma probe device and the plasma processing apparatus of the present disclosure are not limited to the above embodiments, and various modifications and improvements can be made. The contents described in the above embodiments can be combined without contradicting each other.

The substrate processing apparatus of the present disclosure can be applied to any type of a capacitively coupled plasma (CCP), an inductively coupled plasma (ICP), a radial line slot antenna, an electron cyclotron resonance plasma (ECR), and a helicon wave plasma (HWP).

In this specification, the semiconductor wafer W has been described as an example of the substrate. However, the substrate is not limited thereto, and may be various substrates used for LCD (Liquid Crystal Display) and FPD (Flat Panel Display), a CD substrate, a printed board, or the like.

While the present disclosure has been shown and described with respect to the embodiments, it will be understood by those skilled in the art that various changes and modifications may be made without departing from the scope of the present disclosure as defined in the following claims.

What is claimed is:

1. A plasma probe device comprising:
   an antenna unit installed in interior space of a wall defining a processing chamber or interior space of a mounting table through a sealing member;
   an electrode connected to the antenna unit; and
   a dielectric support portion made of a dielectric material and configured to support the antenna unit in the interior space of the wall or in the interior space of the mounting table,
   wherein a first portion of a front end surface of the antenna unit is exposed through an opening in the wall or an opening in the mounting table, the opening communicating with the interior space of the wall or the interior space of the mounting table,
   wherein a second portion of the front end surface of the antenna unit around the first portion is separated from a facing surface of the wall or a facing surface of the mounting table with a gap, the facing surface of the wall defining the interior space of the wall and facing the second portion of the front end surface of the antenna unit, the facing surface of the mounting table defining the interior space of the mounting table and facing the second portion of the front end surface of the antenna unit,
   wherein the front end surface of the antenna unit is depressed from a surface of the wall at an opposite side of the facing surface of the wall or a surface of the mounting table at an opposite side of the facing surface of the mounting table.

2. The plasma probe device of claim 1, wherein a leading end portion of the antenna unit has a disc shape, and a ratio of a dimension in a depth direction of the dielectric support portion to a diameter of the leading end portion is set within a range from 0.44 to 0.54.

3. The plasma probe device of claim 1, wherein at least one of a recess or a protrusion is formed at the front end surface of the antenna unit.

4. The plasma probe device of claim 1, wherein the front end surface of the antenna unit is curved in a concave shape or in a convex shape.

5. The plasma probe device of claim 1, wherein at least a region from the opening to the sealing member on the front end surface of the antenna unit and on a surface of the wall or the mounting table in the vicinity of the opening is covered with a $Y_2O_3$ film.

6. The plasma probe device of claim 1, wherein the dielectric support portion is made of polytetrafluoroethylene (PTFE).

7. The plasma probe device of claim 1, wherein a plurality of antenna units is installed through the sealing member at a plurality of openings arranged in a circumferential direction.

8. The plasma probe device of claim 7, wherein the plurality of openings is arranged at a regular interval in the circumferential direction and has a slit shape.

9. The plasma probe device of claim 7, wherein the plurality of openings is formed in at least one of a sidewall of the processing chamber, a ceiling wall of the processing chamber, and an outer peripheral portion of the mounting table.

10. A plasma processing apparatus comprising:
    a processing chamber defined at least by a wall;

a plurality of microwave radiation mechanisms configured to radiate microwaves outputted from an output unit of a microwave plasma source into the processing chamber; and a plasma probe device including:

an antenna unit installed in an interior space of the wall or in an interior space of a mounting table via a sealing member;

an electrode connected to the antenna unit; and a dielectric support portion made of a dielectric material and configured to support the antenna unit in the interior space of the wall or the interior space of the mounting table, wherein a first portion of a front end surface of the antenna unit is exposed through an opening in the wall or an opening in the mounting table, the opening communicating with the interior space of the wall or the interior space of the mounting table, wherein a second portion of the front end surface of the antenna unit around the first portion is separated from a facing surface of the wall or a facing surface of the mounting table with a gap, the facing surface of the wall defining the interior space of the wall and facing the second portion of the front end surface of the antenna unit, the facing surface of the mounting table defining the interior space of the mounting table and facing the second portion of the front end surface of the antenna unit, wherein the front end surface of the antenna unit is depressed from a surface of the wall at an opposite side of the facing surface of the wall or a surface of the mounting table at an opposite side of the facing surface of the mounting table.

11. The plasma processing apparatus of claim 10, comprising:

a plurality of plasma probe devices, wherein a plurality of antenna units is installed through the sealing member at a plurality of openings arranged in the circumferential direction.

* * * * *